United States Patent
Tani et al.

(10) Patent No.: US 9,385,104 B2
(45) Date of Patent: Jul. 5, 2016

(54) BONDING APPARATUS

(71) Applicant: Shinkawa Ltd., Tokyo (JP)

(72) Inventors: Daisuke Tani, Tokyo (JP); Koichi Takahashi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/561,572

(22) Filed: Dec. 5, 2014

(65) Prior Publication Data

US 2015/0087083 A1    Mar. 26, 2015

Related U.S. Application Data

(63) Continuation of application No. PCT/JP2013/065575, filed on Jun. 5, 2013.

(30) Foreign Application Priority Data

Jun. 11, 2012   (JP) .................................. 2012-131510
Mar. 25, 2013   (JP) .................................. 2013-061589

(51) Int. Cl.
*G05G 15/00*     (2006.01)
*H01L 23/00*     (2006.01)
(Continued)

(52) U.S. Cl.
CPC ............ *H01L 24/75* (2013.01); *B32B 37/0046* (2013.01); *B32B 41/00* (2013.01);
(Continued)

(58) Field of Classification Search
CPC ......... H01L 23/00; H01L 23/48; H01L 25/00; B32B 41/00; B32B 37/00; H05K 3/30
USPC .......... 438/5; 156/351; 29/740, 741, 742, 832
See application file for complete search history.

(56) References Cited

U.S. PATENT DOCUMENTS 5,834,838 A * 11/1998 Anderson .............. H01L 22/20
                                                                 267/693
7,905,268 B2 * 3/2011 Masuda ................. B23K 20/10
                                                                 156/281
(Continued)

FOREIGN PATENT DOCUMENTS

JP       2002-110742       4/2002
(Continued)

OTHER PUBLICATIONS

Written Opinion of the International Searching Authority dated Aug. 20, 2013, from corresponding International Application No. PCT/JP2013/065575.
(Continued)

*Primary Examiner* — Caleb Henry
(74) *Attorney, Agent, or Firm* — Katten Muchin Rosenman LLP

(57) ABSTRACT

Provided is a flip-chip bonding apparatus (500) capable of stacking and bonding a second-layer of the semiconductor chip (30) onto a first-layer of the semiconductor chip (20) having first through-silicon vias, the second-layer of the semiconductor chip (30) having second through-silicon vias at positions corresponding to the first through-silicon vias. The flip-chip bonding apparatus (500) includes: a double-view camera (16) configured to take images of the chips (20) and (30); and a control unit (50) having a relative-position detection program (53) for detecting relative positions of the first-layer of the semiconductor chip (20) and the second-layer of the semiconductor chip (30) that are stacked and bonded based on an image of the first through-silicon vias on a surface of the first-layer of the semiconductor chip (20) taken by the double-view camera (16) before stacked bonding, and an image of the second through-silicon vias on a surface of the second-layer of the semiconductor chip (30) taken by the double-view camera (16) after stacked bonding. This provides accurate connection between through-silicon vias using a simple method.

6 Claims, 11 Drawing Sheets

(51) Int. Cl.
  *H01L 23/544* (2006.01)
  *B32B 37/00* (2006.01)
  *B32B 41/00* (2006.01)
  *H01L 23/48* (2006.01)
  *H01L 25/00* (2006.01)

(52) U.S. Cl.
  CPC ........... *H01L 23/481* (2013.01); *H01L 23/544* (2013.01); *H01L 24/81* (2013.01); *H01L 24/83* (2013.01); *H01L 25/50* (2013.01); *B32B 2309/72* (2013.01); *B32B 2313/00* (2013.01); *B32B 2457/14* (2013.01); *H01L 2223/5448* (2013.01); *H01L 2223/54426* (2013.01); *H01L 2224/13101* (2013.01); *H01L 2224/16145* (2013.01); *H01L 2224/32146* (2013.01); *H01L 2224/75753* (2013.01); *H01L 2224/75754* (2013.01); *H01L 2224/75901* (2013.01); *H01L 2224/8113* (2013.01); *H01L 2224/81815* (2013.01); *H01L 2224/81908* (2013.01); *H01L 2224/8313* (2013.01); *H01L 2224/83123* (2013.01); *H01L 2224/83129* (2013.01)

(56) References Cited

U.S. PATENT DOCUMENTS

| | | | | |
|---|---|---|---|---|
| 8,710,654 | B2* | 4/2014 | Tsukiyama | H01L 23/49811 257/686 |
| 8,981,558 | B2* | 3/2015 | Ide | H01L 23/498 257/737 |
| 9,117,826 | B2* | 8/2015 | Kinoshita | H01L 23/544 |
| 2005/0230804 | A1* | 10/2005 | Tanida | H01L 23/481 257/690 |
| 2008/0127486 | A1 | 6/2008 | Hirara et al. | |
| 2011/0018129 | A1* | 1/2011 | Suzuki | H01L 24/10 257/737 |
| 2011/0180877 | A1* | 7/2011 | Koketsu | H01L 23/544 257/368 |
| 2012/0126844 | A1* | 5/2012 | Yasuta | G01R 31/2893 324/756.07 |
| 2014/0183758 | A1* | 7/2014 | Nakamura | H01L 24/97 257/777 |
| 2014/0287541 | A1* | 9/2014 | Yasumura | H01L 23/544 438/15 |
| 2014/0312511 | A1* | 10/2014 | Nakamura | H01L 25/065 257/777 |
| 2015/0008254 | A1* | 1/2015 | Wasserman | B23K 3/085 228/180.1 |
| 2015/0050778 | A1* | 2/2015 | Asahi | H01L 24/75 438/108 |
| 2015/0123270 | A1* | 5/2015 | Tsukiyama | H01L 24/81 257/737 |
| 2015/0201497 | A1* | 7/2015 | Cheah | H01L 23/49833 361/764 |
| 2015/0243605 | A1* | 8/2015 | Yasumura | H01L 23/544 438/15 |

FOREIGN PATENT DOCUMENTS

| | | |
|---|---|---|
| JP | 2003-197682 | 7/2003 |
| JP | 2004-146776 | 5/2004 |
| JP | 2006-041006 | 2/2006 |
| JP | 2007-012802 | 1/2007 |
| WO | 2006/062091 | 6/2006 |
| WO | 2011/087003 | 7/2011 |

OTHER PUBLICATIONS

International Search Report dated Aug. 20, 2013, from corresponding International Application No. PCT/JP2013/065575.

* cited by examiner

US 9,385,104 B2

BONDING APPARATUS

TECHNICAL FIELD

The present invention relates to bonding apparatuses, in particular to a structure of a flip-chip bonding apparatus and a method of manufacturing a semiconductor device using the flip-chip bonding apparatus.

BACKGROUND ART

Flip-chip bonding apparatuses have been widely used as an apparatus for bonding a semiconductor chip to a circuit board. A typical flip-chip bonding apparatus bonds a semiconductor chip to a circuit board by suctioning and fixing the circuit board onto a bonding stage, suctioning and holding the semiconductor chip at a tip of a bonding tool with a joining face (a surface on which a bump is formed) of the semiconductor chip facing down, moving the bonding tool down toward a surface of the circuit board, pressing the bump of the semiconductor chip against the circuit board, and heating.

In the flip-chip bonding apparatus, it is necessary to press the semiconductor chip against the circuit board while a position of the semiconductor chip suctioned by the bonding tool is aligned with a bonding position of the circuit board. Therefore, there is a method of providing an up-down double-view camera between a lower surface of the semiconductor chip suctioned by the bonding tool and an upper surface of the circuit board, taking an image of the lower surface of the semiconductor chip suctioned by the bonding tool and an image of the upper surface of the circuit board, and adjusting relative positions of the semiconductor chip and the circuit board based on positions of alignment marks respectively of the semiconductor chip and the circuit board shown in the images (see PTL 1, for example). Alternatively, there is proposed a method of using a double-view camera having two different focal lengths with respect to the bonding tool and the circuit board for the flip-chip bonding apparatus, and of taking clear images even when a distance between the double-view camera and the semiconductor chip and a distance between the double-view camera and the circuit board are different (see PTL 2, for example).

CITATION LIST

Patent Literature

PTL 1: Japanese Unexamined Patent Application Publication No. 2002-110742
PTL 2: Japanese Patent No. 4642565

SUMMARY OF INVENTION

Technical Problem

In such a situation, a method of manufacturing a stacked semiconductor device by stacking semiconductor chips having through-silicon vias (TSVs) has been in use in recent years. In this method, a plurality of through-silicon via that penetrate through respective semiconductor chips are disposed at the same position of the corresponding semiconductor chips that are to be stacked, and when the semiconductor chips are stacked, the through-silicon vias are electrically connected to each other so as to configure a common electrode extending in a direction of the stack. According to this method, the semiconductor chips that have been stacked are electrically connected to each other via the plurality of through-silicon vias. Therefore it is possible to electrically connect a plurality of semiconductor chips without using other wiring or connecting means such as wires.

Each of the semiconductor chips used in such a stacked semiconductor device is typically provided with several to several tens of through-silicon vias, and connection between the corresponding through-silicon vias of the semiconductor chips is required to be ensured. Therefore, it is necessary to reduce displacement between positions of the semiconductor chips that are to be stacked as compared to a case in which a semiconductor chip is bonded to a circuit board as in the conventional techniques described in PTLs 1 and 2, for example.

Unfortunately, as through-silicon vias are joined to each other by soldering, solder in a molten state comes between the through-silicon vias when semiconductor chips disposed one above the other are bonded with their positions aligned, and therefore the positions may often go out of alignment before the solder become hardened. Further, there is a case in which positional displacement may occur to an extent that the through-silicon vias are displaced due to unclearness of alignment marks. There is also a case in which displacement between joining positions of the through-silicon vias may occur due to variation in bonding conditions such as temperature during continuous bonding.

In addition, a joining face between the through-silicon vias becomes invisible outside once the semiconductor chips are stacked. Accordingly, it is not possible to easily find whether or not the through-silicon vias are connected precisely, and it is necessary to determine the bonding conditions by separating the semiconductor chips that are once bonded or by cutting the stacked semiconductor device after the connection, for example, to confirm a state of connection between the through-silicon vias. Furthermore, when displacement between the joining positions of the through-silicon vias occurs during bonding after the bonding conditions have been determined, it is not possible to find poor connection between the through-silicon vias until a result of product inspection after bonding such as defective conduction is obtained.

Thus, an object of the present invention is to provide accurate connection between through-silicon vias using a simple method.

Solution to Problem

A bonding apparatus according to the present invention includes: a camera configured to take images of semiconductor chips; and a control unit configured to perform image processing of the images taken by the camera, and configured to perform bonding control of stacking and bonding a second-layer of the semiconductor chips onto a first-layer of the semiconductor chips, the first-layer of the semiconductor chip having a first through-silicon via, the second-layer of the semiconductor chip having a second through-silicon via at positions corresponding to the first through-silicon via. The control unit includes: relative position detecting means configured to detect relative positions of the layers of the semiconductor chips that have been stacked and bonded based on an image of the first through-silicon via on a first surface of the first-layer of the semiconductor chip taken by the camera before stacked bonding, and an image of the second through-silicon via on a first surface of the second-layer of the semiconductor chip taken by the camera after stacked bonding.

Preferably, in the bonding apparatus according to the present invention, the relative positions can be represented by one or more of positional displacement of the second-layer of the semiconductor chip in a direction along a reference axis on the first surface of the first-layer of the semiconductor chip, positional displacement of the second-layer of the semiconductor chip in a direction perpendicular to the reference axis, and a rotational angle of the second-layer of the semiconductor chip with respect to the reference axis.

Preferably, in the bonding apparatus according to the present invention, the first-layer of the semiconductor chip and the second-layer of the semiconductor chip can be two adjacent layers of the semiconductor chips. Alternatively, it is preferable that the first-layer of the semiconductor chip be an initial-layer of the semiconductor chips, and the second-layer of the semiconductor chip be a different one of the semiconductor chips that is stacked and bonded on top of the initial-layer of the semiconductor chip.

Preferably, in the bonding apparatus according to the present invention, the control unit can include: first imaging means configured to take the image of the first through-silicon via on the first surface of the first-layer of the semiconductor chip using the camera before stacked bonding; first bonding means configured to stack and bond the second-layer of the semiconductor chip onto the first-layer of the semiconductor chip by aligning a first alignment mark on the first surface of the first-layer of the semiconductor chip taken by the camera before stacked bonding and a second alignment mark on a second surface of the second-layer of the semiconductor chip taken by the camera before stacked bonding; second imaging means configured to take the image of the second through-silicon vias on the first surface of the second-layer of the semiconductor chip using the camera after stacked bonding by the first bonding means; and offset setting means configured to detect the relative positions of the-layers of the semiconductor chips based on the image of the first through-silicon vias taken by the first imaging means and the image of the second through-silicon vias taken by the second imaging means, and to set the detected relative positions as an amount of offset in stacked bonding.

Preferably, in the bonding apparatus according to the present invention, the control unit can include: second bonding means configured to stack and bond the second-layer of the semiconductor chip onto the first-layer semiconductor chip by displacing the second-layer of the semiconductor chip by the amount of offset set by the offset setting means from a position at which the first alignment mark and the second alignment mark are aligned; third imaging means configured to take the image of the second through-silicon vias on the first surface of the second-layer of the semiconductor chip by the camera after stacked bonding by the second bonding means; and displacement detecting means configured to detect an amount of displacement of the relative positions of the-layers of the semiconductor chips based on the image of the first through-silicon vias taken by the first imaging means and the image of the second through-silicon vias taken by the third imaging means.

Preferably, in the bonding apparatus according to the present invention, the control unit can include: offset correcting means configured to correct the amount of offset by a predetermined percentage of the amount of displacement when the amount of displacement detected by the displacement detecting means is smaller than a first threshold value and equal to or greater than a second threshold value.

A method of manufacturing a semiconductor device according to the present invention includes: a step of preparing a bonding apparatus configured to stack and bond a second-layer of the semiconductor chip onto a first-layer of the semiconductor chip having first through-silicon vias, the second-layer of the semiconductor chip having second through-silicon vias at positions corresponding to the first through-silicon vias; a first imaging step of taking an image of the first through-silicon vias on a first surface of the first-layer of the semiconductor chip using a camera before stacked bonding; a first bonding step of stacking and bonding the second-layer of the semiconductor chip onto the first-layer of the semiconductor chip by aligning a first alignment mark on the first surface of the first-layer of the semiconductor chip taken by the camera before stacked bonding and a second alignment mark on a second surface of the second-layer of the semiconductor chip taken by the camera before stacked bonding; a second imaging step of taking an image of the second through-silicon vias on the first surface of the second-layer of the semiconductor chip using the camera after the first bonding step; and an offset setting step of detecting relative positions of the-layers of the semiconductor chips based on the image of the first through-silicon vias and the image of the second through-silicon vias, and to set the detected relative positions as an amount of offset in stacked bonding.

Preferably, the method of manufacturing a semiconductor device according to the present invention can further include: a second bonding step of stacking and bonding the second-layer of the semiconductor chip onto the first-layer of the semiconductor chip by displacing the second-layer of the semiconductor chip by the amount of offset from a position at which the first alignment mark and the second alignment mark are aligned; a third imaging step of taking the image of the second through-silicon vias on the first surface of the second-layer of the semiconductor chip by the camera after the second bonding step; and a displacement detecting step of detecting an amount of displacement of the relative positions of the-layers of the semiconductor chips based on the image of the first through-silicon vias taken by the first imaging means and the image of the second through-silicon vias taken by the third imaging means.

Preferably, in the method of manufacturing a semiconductor device according to the present invention, the first-layer semiconductor chip and the second-layer semiconductor chip can be two adjacent-layers of the semiconductor chips. Alternatively, it is preferable that the first-layer semiconductor chip be an initial-layer semiconductor chips, and the second-layer chip be a different one of the semiconductor chips that is stacked and bonded on top of the initial-layer chip.

Advantageous Effect of Invention

The present invention has an advantageous effect of providing accurate connection between through-silicon vias using a simple method.

DESCRIPTION OF EMBODIMENT

Figure 1:
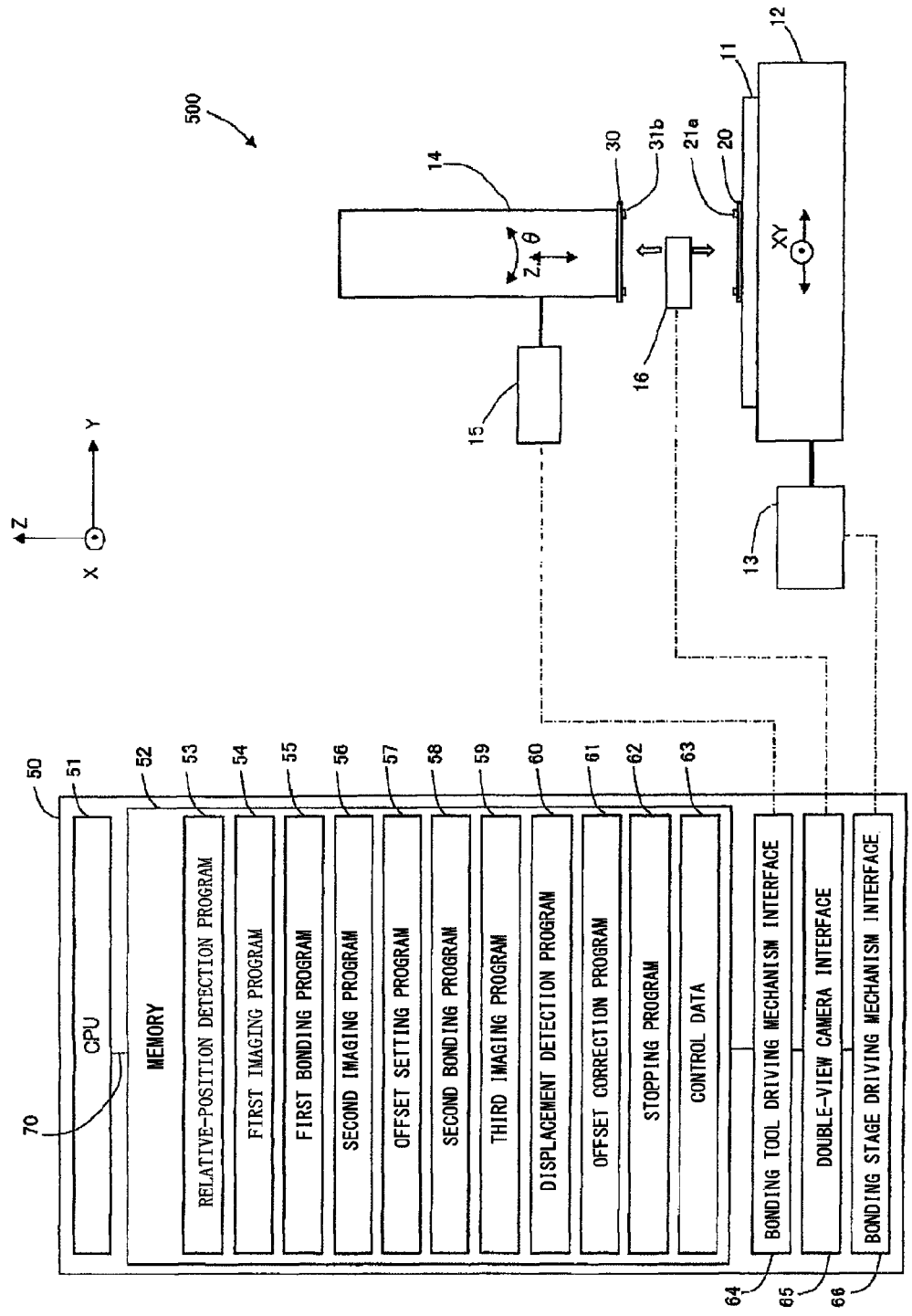
FIG. 1 is a system diagram illustrating a configuration of a bonding apparatus according to an embodiment of the present invention.
Figure 2:
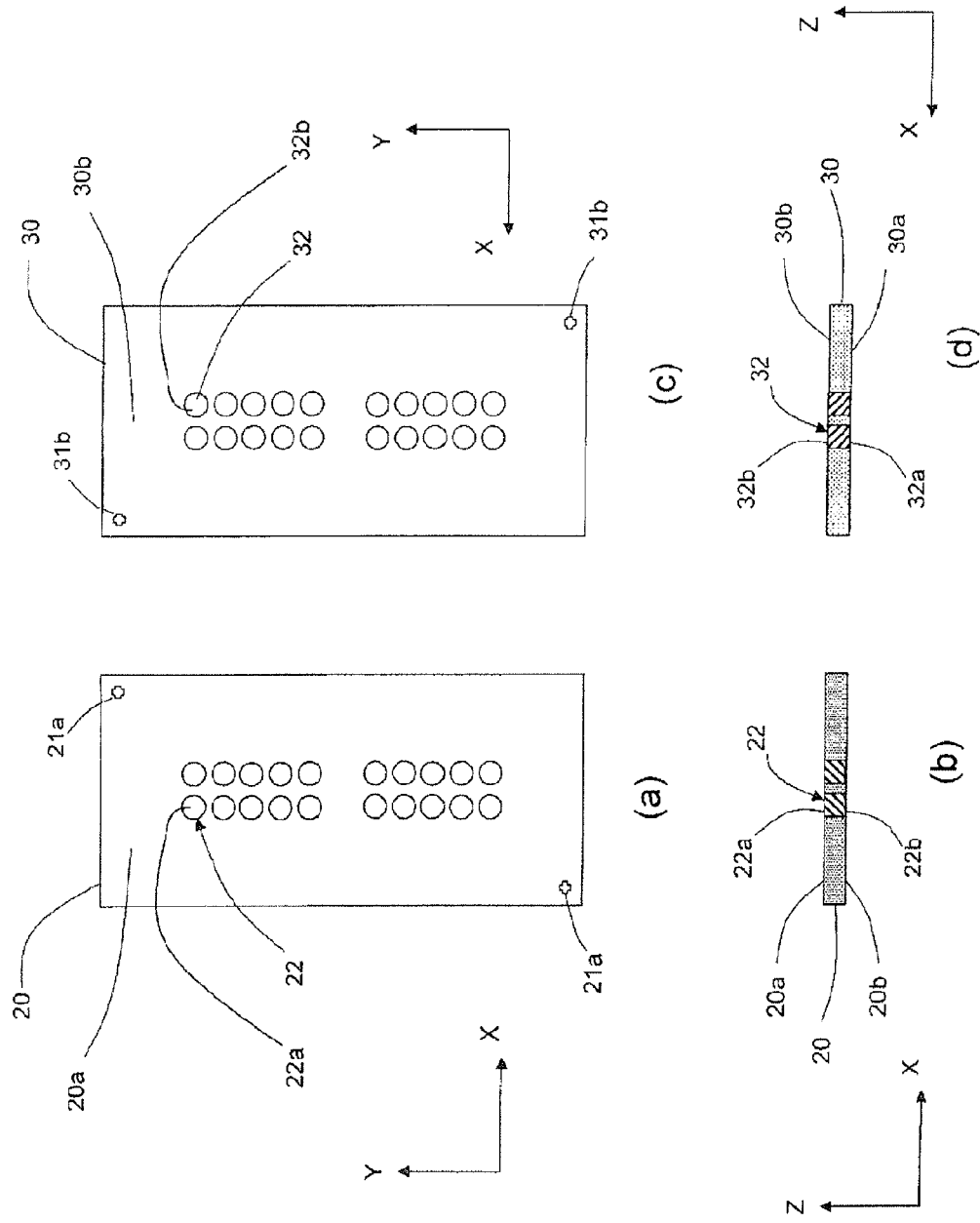
FIG. 2 is an illustrative diagram of an image of a first surface of a first-layer of the semiconductor chip, an image of a second surface of a second-layer of the semiconductor chip, and cross-sections of the semiconductor chips of the respective-layers.

Hereinafter, a bonding apparatus according to an embodiment of the present invention will be described with reference to the drawings. Referring to FIG. 1, a flip-chip bonding apparatus 500 of this embodiment includes a bonding stage 11 for suctioning and fixing a first-layer of the semiconductor chip 20, an XY table 12 for supporting the bonding stage 11 movably in an XY direction (horizontal direction), a bonding stage driving mechanism 13 connected to the XY table 12 and configured to drive the bonding stage 11 in the XY direction, a bonding tool 14 having a tip for suctioning a second-layer of the semiconductor chip 30, a bonding tool driving mechanism 15 configured to move the bonding tool 14 in a Z direction (vertical direction) and a θ direction, a double-view camera 16 capable of simultaneously taking images upward and downward as illustrated by outlined arrows in the figure, and a control unit 50 configured to perform image processing of the images taken by the double-view camera 16 and to control bonding. In FIG. 1, the XY direction corresponds to a right and left direction in the figure, the Z direction corresponds to an up and down direction in the figure, and the θ direction corresponds to a direction of rotation around a Z axis.

Referring to FIG. 1, the control unit 50 is a computer including therein a CPU 51 configured to perform signal processing, a memory 52 storing data such as a control program and control data, a bonding tool driving mechanism interface 64 for inputting and outputting a control signal to and from the bonding tool driving mechanism, a double-view camera interface 65 for inputting and outputting a control signal and an image signal to and from the double-view camera 16, and a bonding stage driving mechanism interface 66 for inputting and outputting a control signal to and from the bonding stage driving mechanism. The CPU 51, the memory 52, and the interfaces 64, 65, and 66 are connected to each other via a data bus 70. Further, the bonding tool driving mechanism 15, the double-view camera 16, and the bonding stage driving mechanism 13 are configured to be driven based on a command from the CPU 51 of the control unit 50.

Referring to FIG. 1, the memory 52 stores a relative-position detection program 53 as relative position detecting means, a first imaging program 54 as first imaging means, a first bonding program 55 as first bonding means, a second imaging program 56 as second imaging means, an offset setting program 57 as offset setting means, a second bonding program 58 as second bonding means, a third imaging program 59 as third imaging means, a displacement detection program 60 as displacement detecting means, an offset correction program 61 as offset correcting means, a stopping program 62 as stopping means, and control data 63 such as images taken by the double-view camera 16, image data that has been subjected to image processing, and an amount of offset. The programs 53-62 will be described later.

Steps for stacking and bonding the second-layer of the semiconductor chip 30 onto the first-layer of the semiconductor chip 20 by the flip-chip bonding apparatus 500 according to this embodiment thus configured (a manufacturing process of a semiconductor device) will be described with reference to FIG. 2 to FIG. 6.

A teaching operation from Step S101 to Step S108 in FIG. 3 will be described in the first place. First, the first-layer of the semiconductor chip 20 is suctioned and fixed onto the bonding stage 11, and the second-layer of the semiconductor chip 30 is suctioned to the tip of the bonding tool 14 from a wafer using a pick-up unit that is not depicted.

Referring to FIG. 2(a), on a first surface 20a (a surface on a positive side in the Z direction in FIG. 1) of the first-layer of the semiconductor chip 20, cross-shaped alignment marks 21a are provided respectively at an upper-right corner and a lower-left corner. Further, the first-layer of the semiconductor chip 20 is provided with a plurality of first through-silicon vias 22. As illustrated in FIG. 2(b), the first through-silicon vias 22 are provided between the first surface 20a and a second surface 20b of the first-layer of the semiconductor chip 20 such that the electrodes penetrate through the chip perpendicularly to the first surface 20a and the second surface 20b. First surfaces 22a of the first through-silicon vias 22 are exposed at the first surface 20a of the first-layer of the semiconductor chip 20, and second surfaces 22b of the first through-silicon vias 22 are exposed at the second surface 20b of the first-layer of the semiconductor chip 20 at the same positions as the first surfaces 22a of the corresponding first through-silicon vias 22.

The second-layer of the semiconductor chip 30 is also provided with second through-silicon vias 32 at the same positions as those in the first-layer of the semiconductor chip 20. In other words, the second through-silicon vias 32 are provided at positions that coincide with positions of the first through-silicon vias 22 when the second-layer of the semiconductor chip 30 is turned over and its second surface 30b is lapped over the first surface 20a of the first-layer of the semiconductor chip 20. Further, similarly to the first-layer of the semiconductor chip 20, as illustrated in FIG. 2(d), the second through-silicon vias 32 are provided between a first surface 30a and the second surface 30b of the second-layer of the semiconductor chip 30 such that the electrodes penetrate through the of the semiconductor chip perpendicularly to the first surface 30a and the second surface 30b. First surfaces 32a of the second through-silicon vias 32 are exposed at the first surface 30a of the second-layer of the semiconductor chip 30, and second surfaces 32b of the second through-silicon vias 32 are exposed at the second surface 30b of the second-layer of the semiconductor chip 30 at the same positions as the first surfaces 22a of the corresponding second through-silicon vias 32. FIG. 2(c) shows the second-layer of the semiconductor chip 30 when viewed from a side of the second surface 30b. On the second surface 30b of the second-layer of the semiconductor chip 30, cross-shaped alignment marks 31b are provided respectively at an upper-left corner and a lower-right corner (positions that come to the same positions as the alignment marks 21a when the second-layer of the semiconductor chip 30 is turned over and the second surface 30b is lapped over the first surface 20a of the first-layer of the semiconductor chip 20).

As illustrated in FIG. 1, in an initial state before stacked bonding, the bonding tool 14 is positioned upwardly at a standby position, and the control unit 50 moves the double-view camera 16 between the bonding tool 14 and the bonding stage 11 using a double-view camera driving mechanism that is not depicted. Then, in a visual field below the double-view camera 16 as indicated by the outlined arrow facing downward in FIG. 1, an image of the first surface 20a of the first-layer of the semiconductor chip 20 including the alignment marks 21a and the first surfaces 22a of the first through-silicon vias 22 is obtained as illustrated in FIG. 2(a). Further, in a visual field above the double-view camera 16 as indicated by the outlined arrow facing upward in FIG. 1, an image of the second surface 30b of the second-layer of the semiconductor chip 30 including the alignment marks 31b and the second surfaces 32b of the second through-silicon vias 32 is obtained as illustrated in FIG. 2(c).

The control unit 50 executes the first imaging program 54 shown in FIG. 1. As shown in Step S101 in FIG. 3, the control unit 50 activates the double-view camera 16 to take an image of the first surfaces 22a of the first through-silicon vias 22 on the first surface 20a of the first-layer of the semiconductor chip 20 illustrated in FIG. 2(a), and stores the image in the control data 63 in the memory 52 (first imaging step).

Further, the control unit 50 executes the first bonding program 55 shown in FIG. 1. As shown in Step S102 in FIG. 3, the control unit 50 activates the double-view camera 16 to take an image of the alignment marks 21a on the first surface 20a of the first-layer of the semiconductor chip 20 illustrated in FIG. 2(a), and stores the image in the control data 63 in the memory 52. Then, as shown in Step S103 in FIG. 3, the control unit 50 activates the double-view camera 16 to take an image of the alignment marks 31b on the second surface 30b of the second-layer of the semiconductor chip 30 illustrated in FIG. 2(c) and stores the image in the control data 63 in the memory 52. The control unit 50 performs image processing of the images of the alignment marks 21a and 31b, detects an amount of displacement of a position of each of the alignment marks 21a and 31b in the XY direction or the θ direction, and adjusts a position of the bonding stage 11 in the XY direction using the bonding stage driving mechanism 13 and a position of the bonding tool 14 in the θ direction using the bonding tool driving mechanism 15. Then, when the amount of displacement of the position of each of the alignment marks 21a and 31b in the XY direction or in the θ direction becomes equal to or smaller than zero or a predetermined value, the control unit 50 determines that the positions of the alignment marks 21a and 31b of the first-layer of the semiconductor chip 20 and the second-layer of the semiconductor chip 30 are aligned, and as shown in Step S104 in FIG. 3, outputs a command for moving the bonding tool 14 downward using the bonding tool driving mechanism 15. This command causes the bonding tool 14 to move down as illustrated in FIG. 4, and stacks and bonds the second-layer of the semiconductor chip 30 onto the first-layer of the semiconductor chip 20 as illustrated in FIG. 5(a) to provide a stacked semiconductor device 40 (first bonding step).

When the second-layer of the semiconductor chip 30 is stacked and bonded onto the first-layer of the semiconductor chip 20 as illustrated in FIG. 5(b), a hardened-layer 41 formed by hardened solder that has been molten is provided between each of the first surfaces 22a of the first-layer through-silicon vias 22 and corresponding one of the second surfaces 32b of the second-layer through-silicon vias 32, and the corresponding through-silicon vias 22 and 32 are connected by the hardened-layer 41.

Figure 6:
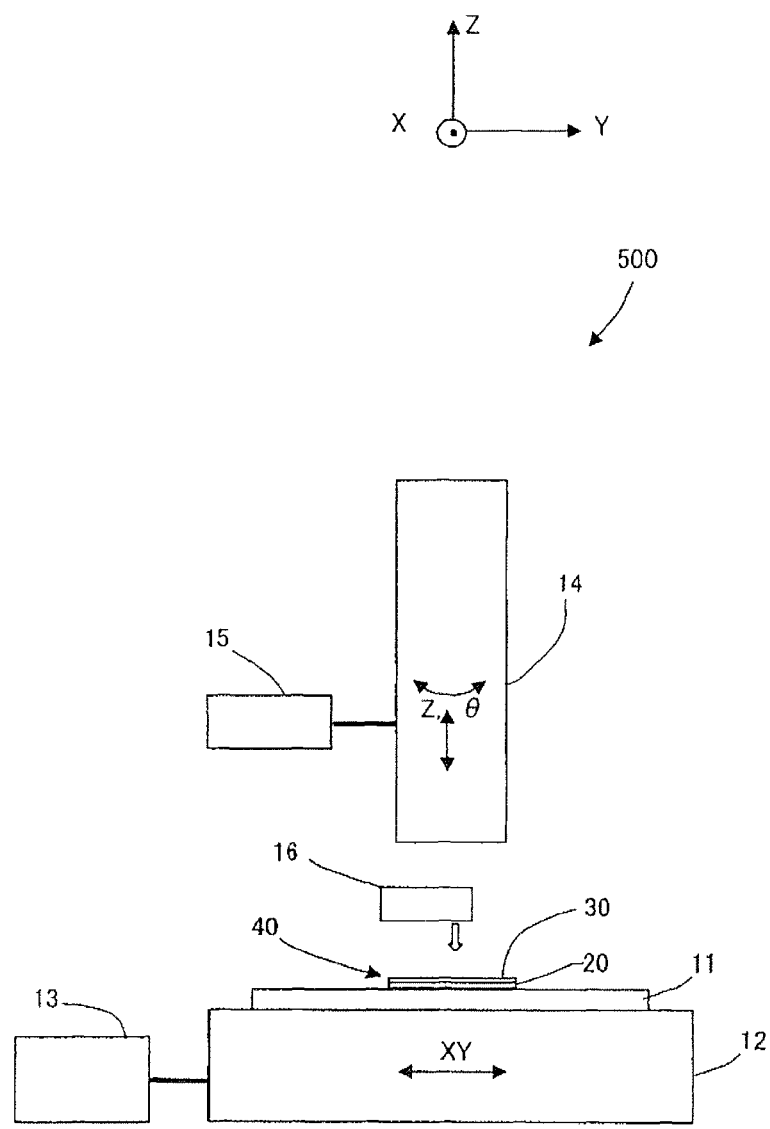
FIG. 6 is an illustrative diagram showing a state in which an image of a first surface of the second-layer of the semiconductor chip is taken after stacked bonding of the bonding apparatus of the present invention.

Referring to FIG. 6, upon completion of the first bonding step, the control unit 50 moves the bonding tool 14 up to the standby position, and moves the double-view camera 16 above the second-layer of the semiconductor chip 30 of the semiconductor device using the double-view camera driving mechanism that is not depicted. In the visual field of the double-view camera 16, an image in which the second-layer of the semiconductor chip 30 is stacked on the first-layer of the semiconductor chip 20 is obtained as illustrated in FIG. 5(a). Although the alignment marks 21a and the first surfaces 22a of the first through-silicon vias on the first-layer of the semiconductor chip 20 are indicated by dash lines in FIG. 5(a), only solid lines in FIG. 5(a), that is, the first surface 30a of the second-layer of the semiconductor chip 30 and the first surfaces 32a of the second through-silicon vias 32, are actually shown in the visual field of the double-view camera 16.

The control unit 50 executes the second imaging program 56 shown in FIG. 1. As shown in Step S105 in FIG. 3, the control unit 50 takes an image of the first surfaces 32a of the second through-silicon vias 32 on the first surface 30a of the second-layer of the semiconductor chip 30, and stores the image in the control data 63 (second imaging step).

The control unit 50 executes the relative-position detection program 53 shown in FIG. 1. As shown in Step S106 in FIG. 3, the control unit 50 causes the image of the first surfaces 22a of the through-silicon vias 22 on the first-layer of the semiconductor chip 20 taken previously in the first imaging step to be overlapped with the image of the through-silicon vias 32a on the second-layer of the semiconductor chip 30 taken in the second imaging step. In FIG. 5(a), the first surface 20a of the first-layer of the semiconductor chip 20 and the first surfaces 22a of the first through-silicon vias 22 that are overlapped are indicated by the dash lines. The images that have been overlapped are shown such that the first surfaces 22a of the through-silicon vias are displaced from the first surfaces 32a of the through-silicon vias.

As described previously, as the through-silicon vias 22 and 32 are provided perpendicularly to the first surface 20a of the first-layer of the semiconductor chip 20 and the first surface 30a of the second-layer of the semiconductor chip 30, the fact that the positions of the first surfaces 22a are displaced from the positions of the first surfaces 32a leads to determination that the first-layer of the semiconductor chip 20 and the second-layer chip 30 are stacked in a displaced manner as illustrated in FIG. 5(b).

Further, as the first-layer of the semiconductor chip 20 and the second-layer of the semiconductor chip 30 are stacked and bonded by aligning the alignment marks 21a and 31b on the respective-layer of the semiconductor chips, relative positions of the first-layer of the semiconductor chip 20 and the second-layer of the semiconductor chip 30 are not displaced too largely and the positions of the plurality of corresponding through-silicon vias 22 and 32 are partially overlapping with each other. Therefore, the control unit 50 determines that amounts of displacement ΔX and ΔY in the XY direction between the first surfaces 22a of the first through-silicon vias 22 and the corresponding first surfaces 32a of the second through-silicon vias 32 that are partially overlapping with each other as illustrated in FIG. 5(a) to represent the relative positions of the first-layer of the semiconductor chip 20 and the second-layer of the semiconductor chip 30. In the example illustrated in FIG. 5(a), the positions of the alignment marks 21a provided on the first surface 20a of the first-layer of the semiconductor chip 20 are also displaced from the positions of the alignment marks 31b provided on the second surface 30b of the second-layer of the semiconductor chip 30. Accordingly, the amounts of displacement ΔX and ΔY are considered to be attributed to positional displacement between the corresponding through-silicon vias 22 and 32 in the XY direction due to an error when the control unit 50 recognizes the positions of the alignment marks based on the images of the alignment marks 21a and 31b, for example, or to positional displacement occurring during stacked bonding due to the molten solder between the through-silicon vias. Then, as shown in Step S107 in FIG. 3, the control unit 50 repeats Steps S101-S106 in FIG. 3 for a predetermined number of times, e.g., n times, and thereafter, as shown in Step S108 in FIG. 3, the control unit 50 sets an average or a median of the amount of displacement as an amount of offset (offset setting step).

In the above embodiment, it has been described that the amounts of displacement ΔX and ΔY in the XY direction between the first surfaces 22a of the first through-silicon vias 22 and the first surfaces 32a of the second through-silicon vias 32 illustrated in FIG. 5(a) (with respect to a reference axis of the first-layer of the semiconductor chip 20, the X direction represents a direction parallel to a side X in a lateral direction of the first-layer of the semiconductor chip 20 in FIG. 5(a), and the Y direction represents a direction perpendicular to the X direction) are determined to be the relative positions of the first-layer of the semiconductor chip 20 and the second-layer of the semiconductor chip 30. However, it is possible to determine the relative positions including positional displacement Δθ of the second-layer of the semiconductor chip in the direction of rotation with respect to the first-layer of the semiconductor chip 20 using the images of the first surfaces 22a and 32a of the plurality of through-silicon vias 22 and 32, in addition to the amounts of displacement ΔX and ΔY in the XY direction. The positional displacement Δθ in the direction of rotation can be obtained as an rotational angle Δθ with respect to an X axis as a reference, using, for example, amounts of displacement $ΔX_1$ and $ΔY_1$ of the first surfaces 22a and 32a of the through-silicon vias 22 and 32 in the XY direction shown at topmost left in FIG. 5(a), and amounts of displacement $ΔX_2$ and $ΔY_2$ of the through-silicon vias 22 and 32 of the first surfaces 22a and 32a in the XY direction shown at lowermost right in FIG. 5(a) (the through-silicon vias 22 and 32 in the diagonal direction). In this case, an average or a median of the amount of displacement ΔX, ΔY, or Δθ is set as an amount of offset in the X, Y, or θ direction.

With the teaching operation (Steps S106-S108 in FIG. 3) in this embodiment described above, it is possible to perform teaching of the flip-chip bonding apparatus with a simple method of detecting the amount of positional displacement between (relative positions of) the first-layer of the semiconductor chip 20 and the second-layer of the semiconductor chip 30 in stacked bonding, and setting the amount of offset for stacked bonding based on the detected amount of displacement (relative positions), without performing destructive inspection such as confirming of the joining face by separating the first and the second-layer of the semiconductor chip 20 and 30 that have been stacked and bonded, or confirming of the positions of the first and second through-silicon vias 22 and 32 by cutting the stacked semiconductor device 40 that have been stacked and exposing a cross section as illustrated in FIG. 5(b), for example. Thus, it is possible to accurately join the through-silicon vias 22 and 32.

Next, an operation of stacked bonding (Steps S109-S119 in FIG. 3) for manufacturing the stacked semiconductor device 40 after the teaching will be described. Descriptions for steps that are the same as in the teaching operation that has been previously described are omitted.

Similarly to the previous description in the teaching, the control unit 50 first causes the first-layer of the semiconductor chip 20 to be suctioned and fixed onto the bonding stage 11, causes the second-layer of the semiconductor chip 30 to be suctioned to the tip of the bonding tool 14 from the wafer using the pick-up unit that is not depicted, and moves the double-view camera 16 between the bonding stage 11 and the bonding tool 14. Then, the control unit 50 executes the first imaging program 54 shown in FIG. 1. As shown in Step S109 in FIG. 3, the control unit 50 activates the double-view camera 16 to take the image of the first surfaces 22a of the first through-silicon vias 22 on the first surface 20a of the first-layer of the semiconductor chip 20 illustrated in FIG. 2(a), and stores the image in the control data 63 in the memory 52 (first imaging step).

Figure 7:
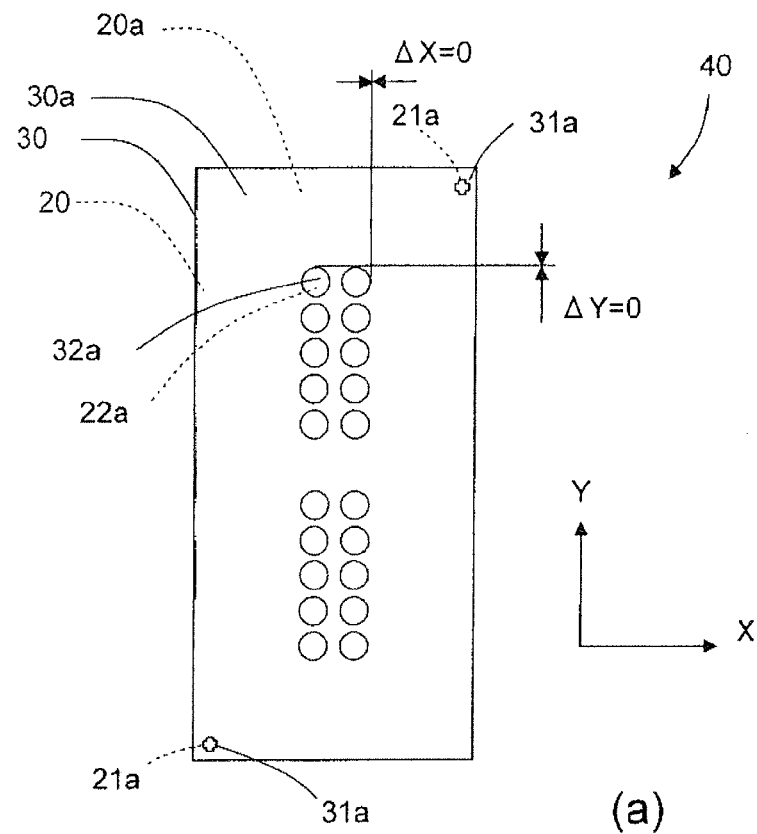
FIG. 7 is an illustrative diagram showing a plan view and a sectional view of the stacked semiconductor device having the first-layer of the semiconductor chip and the second-layer of the semiconductor chip that are stacked by stacked bonding in production of the stacked semiconductor device.
Figure 7:
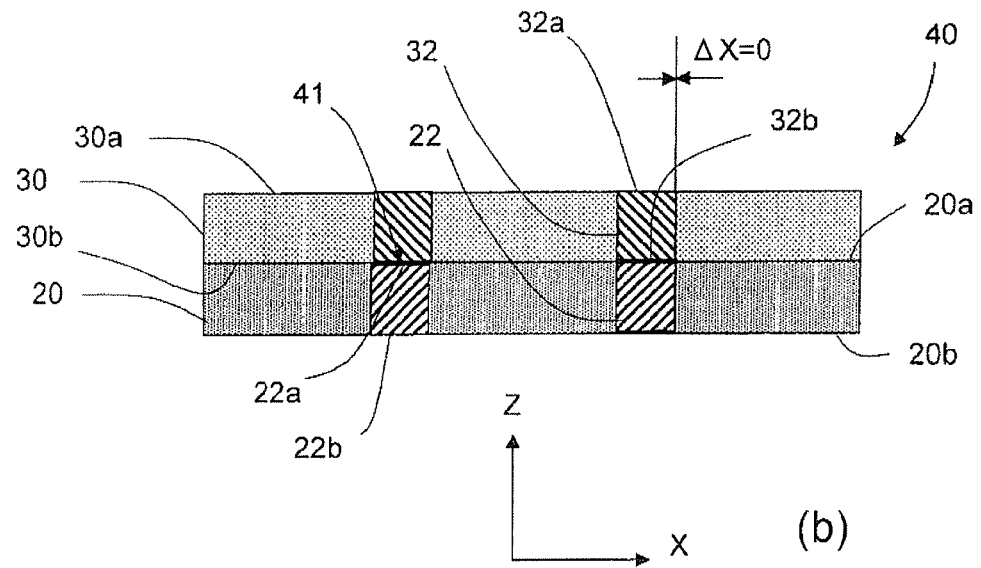

Next, the control unit 50 executes the second bonding program 58 shown in FIG. 1. As shown in Step S110 in FIG. 3, the control unit 50 activates the double-view camera 16 to take the image of the alignment marks 21a on the first surface 20a of the first-layer of the semiconductor chip 20 illustrated in FIG. 2(a), and stores the image in the control data 63 in the memory 52. Then, as shown in Step S111 in FIG. 3, the control unit 50 activates the double-view camera 16 to take the image of the alignment marks 31b on the second surface 30b of the second-layer of the semiconductor chip 30 illustrated in FIG. 2(c) and stores the image in the control data 63 in the memory 52. The control unit 50 performs image processing of the images of the alignment marks 21a and 31b, and detects the amount of displacement of the position of each of the alignment marks 21a and 31b in the XY direction or the θ direction. Then, as shown in Step S112 in FIG. 3, the control unit 50 adjusts the position of the bonding stage 11 in the XY direction and the position of the bonding tool 14 in the θ direction respectively using the bonding stage driving mechanism 13 and the bonding tool driving mechanism 15, so that the amounts of displacement of the position of each of the alignment marks 21a and 31b in the XY direction and in the θ direction correspond to the amounts of offset that have been set in Step S108 in FIG. 3. Then, when the amounts of displacement of the alignment marks 21a and 31b correspond to the amounts of offset, the control unit 50 outputs the command for moving the bonding tool 14 downward using the bonding tool driving mechanism 15 as shown in Step S112 in FIG. 3. This command causes the bonding tool 14 to move down as illustrated in FIG. 4, and stacks and bonds the second-layer of the semiconductor chip 30 onto the first-layer of the semiconductor chip 20 as illustrated in FIG. 7(a) to provide a stacked semiconductor device 40 (second bonding step).

Upon completion of the second bonding step, as illustrated in FIG. 6, the control unit 50 moves the bonding tool 14 up to the standby position, and moves the double-view camera 16 above the second-layer of the semiconductor chip 30 using the double-view camera driving mechanism that is not depicted. The control unit 50 executes the third imaging program 59 shown in FIG. 1. As shown in Step S113 in FIG. 3, the control unit 50 takes an image of the first surfaces 32a of the second through-silicon vias 32 on the first surface 30a of the second-layer of the semiconductor chip 30, and stores the image in the control data 63 (third imaging step).

Figure 3:
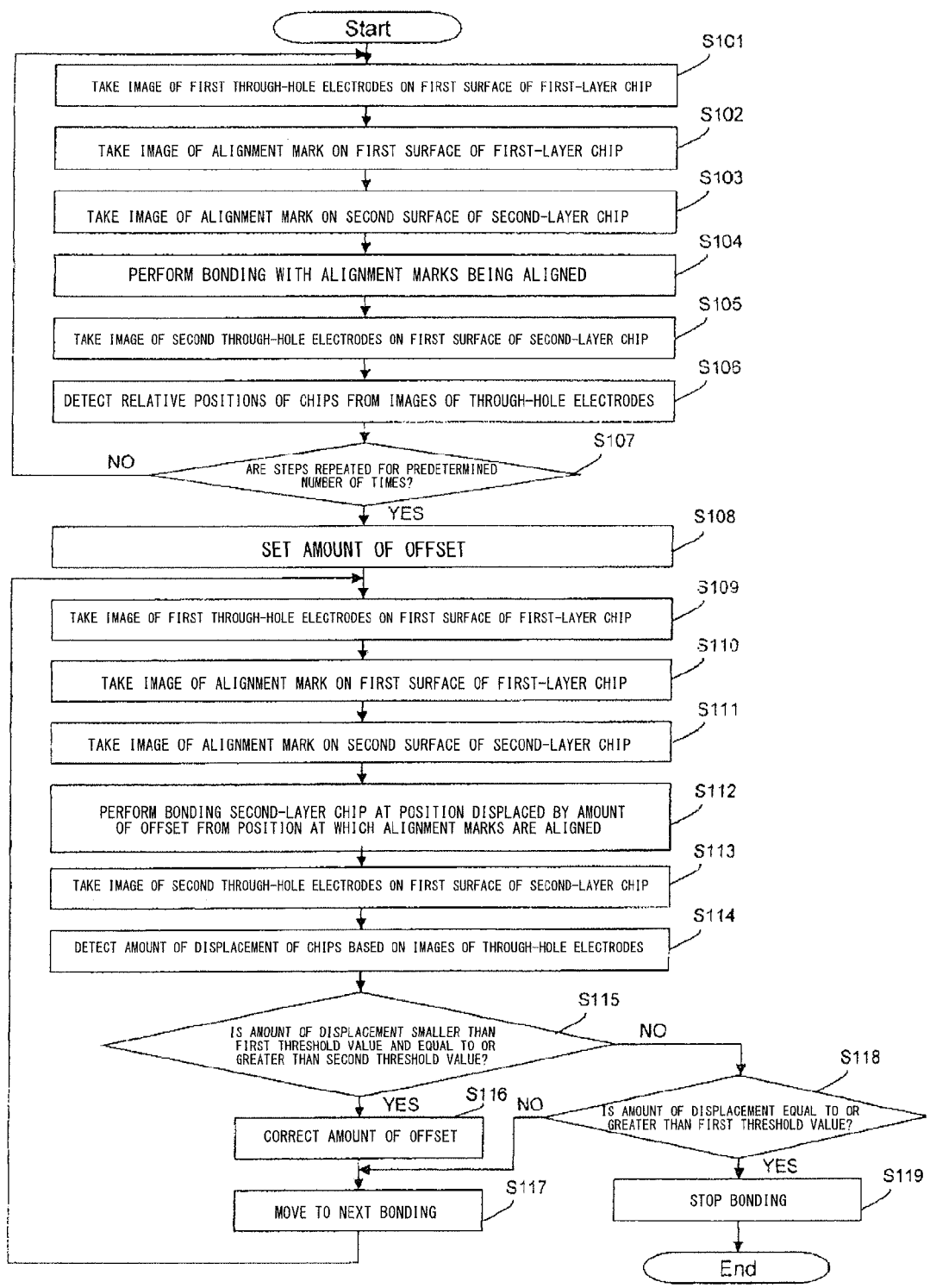
FIG. 3 is a flowchart showing an operation by the bonding apparatus according to the embodiment of the present invention.
Figure 4:
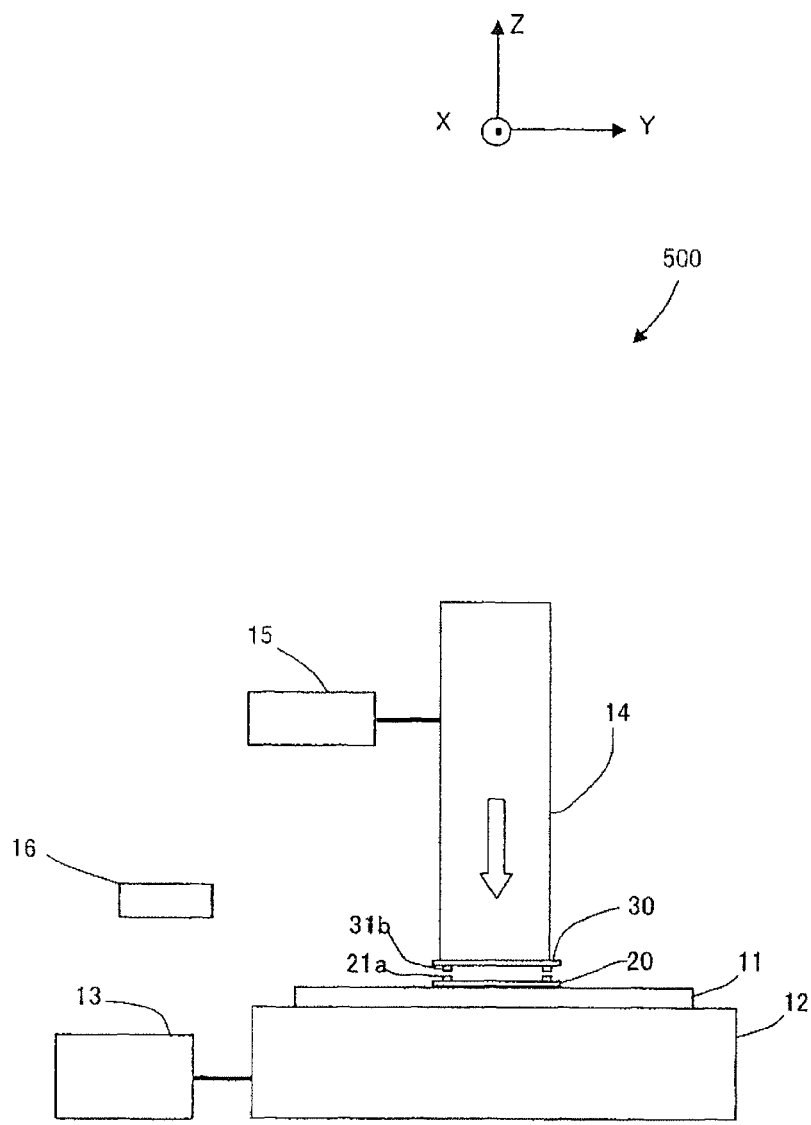
FIG. 4 is an illustrative diagram showing an operation of stacked bonding by the bonding apparatus according to the embodiment of the present invention.
Figure 5:
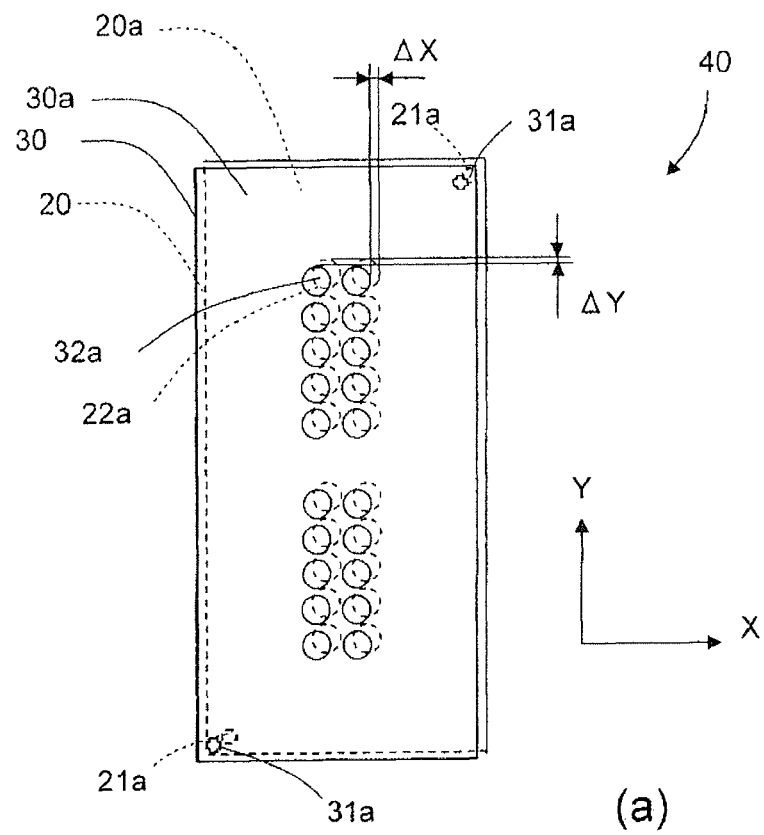
FIG. 5 is an illustrative diagram showing a plan view and a sectional view of a stacked semiconductor device in teaching, having the first-layer of the semiconductor chip and the second-layer of the semiconductor chip that are stacked by stacked bonding.
Figure 5:
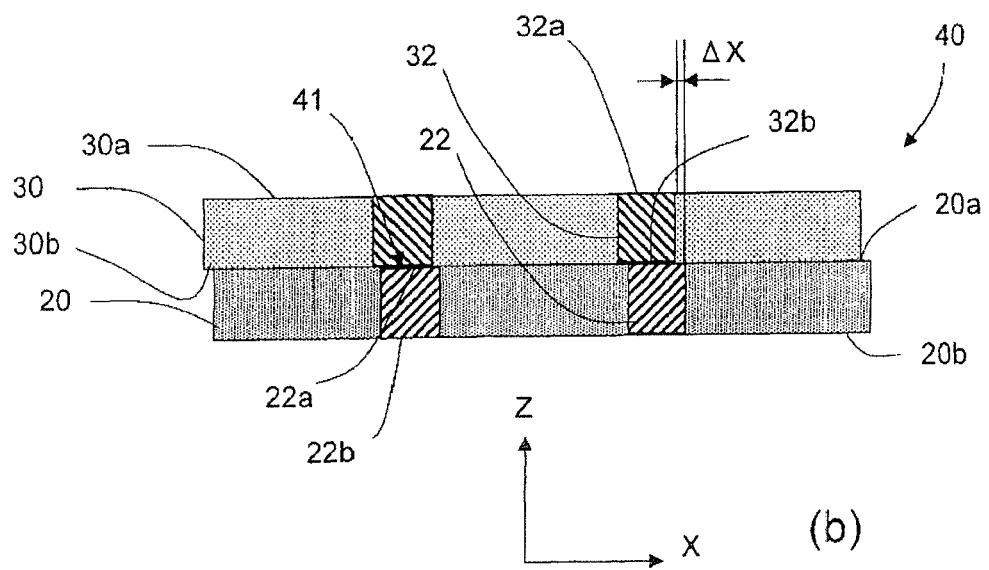

In the above second bonding operation, the second-layer of the semiconductor chip 30 is displaced with respect to the first-layer of the semiconductor chip 20 by the amount of offset that has been set in the teaching operation shown in Steps S101-S108 in FIG. 3. Therefore, after stacked bonding, the amounts of displacement ΔX, ΔY, and Δθ in the teaching operation shown in FIG. 5(a) and FIG. 5(b) should be zero, and the through-silicon vias 22 and 32 should be fully overlapping as shown in FIG. 7(a) and FIG. 7(b). However, due to such reasons as inaccuracy in the alignment marks 21a and 31b on the first-layer of the semiconductor chip 20 and the second-layer of the semiconductor chip 30, a temperature change of the flip-chip bonding apparatus 500, or manufacturing errors in the positions of the through-silicon vias 22 of the first-layer of the semiconductor chip 20 and the through-silicon vias 32 of the second-layer chip 30, even if the amounts of offset are set in the teaching operation (Steps S101-S108 in FIG. 3), there is a case in which the positional displacement between the corresponding through-silicon vias 22 and 32 as shown in FIG. 5(a) and FIG. 5(b) occurs after the second bonding operation.

Thus, after the second bonding operation, the control unit 50 obtains the image of the first surfaces 32a of the second through-silicon vias 32 of the second-layer of the semiconductor chip 30 after stacked bonding using the double-view camera 16 as shown in Step S113 in FIG. 3, executes the displacement detection program 60 shown in FIG. 1 to lap the taken image over the image of the first surfaces 22a of the first through-silicon vias 22 of the first-layer of the semiconductor chip 20 taken in Step S109 in FIG. 3 as shown in Step S114 in FIG. 3, and thereby detects the positions of the first through-silicon vias 22 and the amounts of displacement ΔX, ΔY, and Δθ of the second through-silicon vias 32 (displacement detecting step).

It should be noted that the displacement detection program 60 is the same as the relative-position detection program 53 shown in FIG. 1 described previously other than that this program is executed after the second bonding in which the first-layer of the semiconductor chip 20 and the second-layer of the semiconductor chip 30 are displaced by the amount of offset.

Then, as shown in Step S115 in FIG. 3, when the detected amount of displacement is smaller than a first threshold value as a permissible amount of displacement and equal to or greater than a second threshold value as an amount of displacement that needs to be corrected, the control unit 50 determines that it is necessary to correct the amount of offset, and executes the offset correction program 61 shown in FIG. 1 as shown in Step S116 in FIG. 3. The offset correction program 61 is for increasing or decreasing the amount of offset only by a predetermined percentage, 50%, for example, of the amount of displacement detected in Step S114 in FIG. 3. Then, upon completion of the correction of the amount of offset, the operation of the control unit 50 returns to Step S109 in order to perform the next bonding as shown in Step S117 in FIG. 3. With this, it is possible to accurately join the through-silicon vias 22 and 32 (offset amount correcting step).

It should be noted that an image of first surfaces of first through-silicon vias of a first-layer of the semiconductor chip obtained in Step S109 in FIG. 3 in the next bonding, is the image of first surfaces of the second through-silicon vias of the second-layer of the semiconductor chip in the previous bonding obtained in Step S113 in FIG. 3, and this image is stored in the memory 52. Accordingly, in actual stacked bonding, it is possible to omit Step S109 and directly returns to Step S110 when moving to the next bonding.

Further, as shown in Step S118 in FIG. 3, when the detected amount of displacement exceeds the first threshold value as the permissible amount of displacement, the control unit 50 determines that this stacked bonding is defective, executes the stopping program 62 shown in FIG. 1, as shown in Step S119 in FIG. 3 to stop the flip-chip bonding apparatus 500, and lights a warning lamp to alarm an abnormal condition (stopping step).

With the bonding apparatus of this embodiment described above, it is possible to correct the amount of offset during manufacturing and stop the bonding apparatus when the defective bonding occurs without performing destructive inspection of the first-layer of the semiconductor chip 20 and the second-layer of the semiconductor chip 30 to be stacked, and thus, it is possible to improve qualities of stacked bonding.

While the above embodiment describes the example in which two-layers of the semiconductor chips are stacked and bonded, the present invention can be applied for stacked bonding of a greater number of-layers. Further, the amount of offset in bonding of the first-layer of the semiconductor and the second-layer of the semiconductor and the amount of offset in bonding of the second-layer of the semiconductor and a third-layer of the semiconductor can be different. Moreover, in this embodiment, it is described that stacked bonding is performed by aligning the alignment marks 21a on the first-layer of the semiconductor chip 20 and the alignment marks 31b on the second-layer of the semiconductor chip 30 in teaching operation. However, if a relative distance between the alignment marks is known and stacked bonding is performed by displacing the alignment marks by the relative distance, this is also included in examples of stacked bonding performed by aligning alignment marks even if the alignment marks 21a and 31b are not overlapped.

Furthermore, according to this embodiment, the flip-chip bonding apparatus 500 is described such that the bonding stage 11 moves in the XY direction and the bonding tool moves in the Z direction and the θ direction. However, the present invention is not limited to such a configuration, and can be configured such that the bonding tool moves in the Y, Z, and θ directions, and the bonding stage 11 moves only in the X direction, or such that the bonding stage 11 does not move and the bonding tool moves in the X, Y, Z, and θ directions.

Hereinafter, a process of stacking and bonding of the semiconductor chips of three or more-layers using the flip-chip bonding apparatus 500 illustrated in FIG. 1 (process of manufacturing a semiconductor device in which three or more-layers of the semiconductor chips are stacked and bonded) will be described with reference to FIG. 8 through FIG. 11. Like steps of those described with reference to FIG. 1 through FIG. 7 shall be denoted by like reference numerals, and descriptions for such steps shall be omitted.

A teaching operation from Step S201 to Step S208 in FIG. 8 will be described. This teaching operation is for determining an amount of offset between a first-layer (initial-layer) of the semiconductor chip 100 and a second-layer of the semiconductor chip 200 disposed adjacent to the initial-layer and stacked and bonded on a top side of the initial-layer of the semiconductor chip 100 illustrated in FIG. 10 based on an operation similar to that from Step S101 to Step S108 in FIG. 3.

Figure 8:
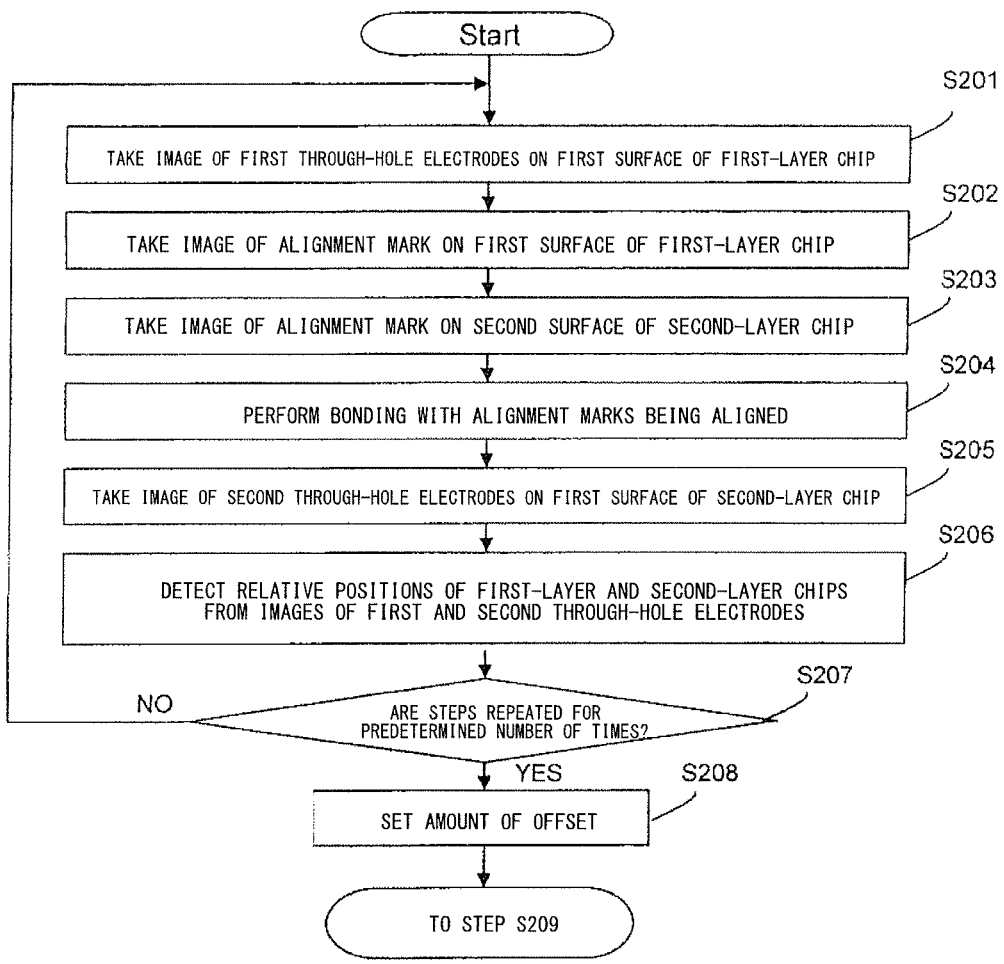
FIG. 8 is a flowchart showing another operation by the bonding apparatus according to the embodiment of the present invention.
Figure 10:
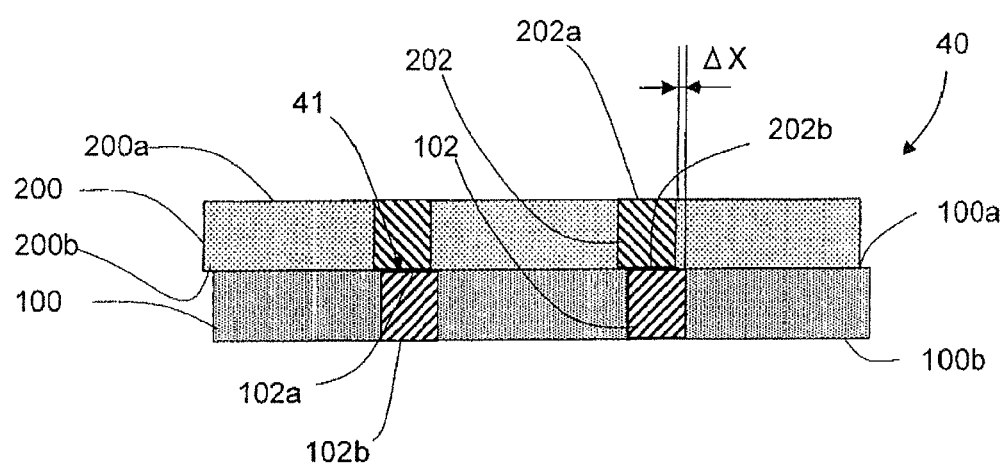
FIG. 10 is a sectional view of the stacked semiconductor device in teaching, having the first-layer of the semiconductor chip and the second-layer of the semiconductor chip that are stacked by stacked bonding.
Figure 10:
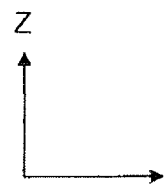
Figure 11:
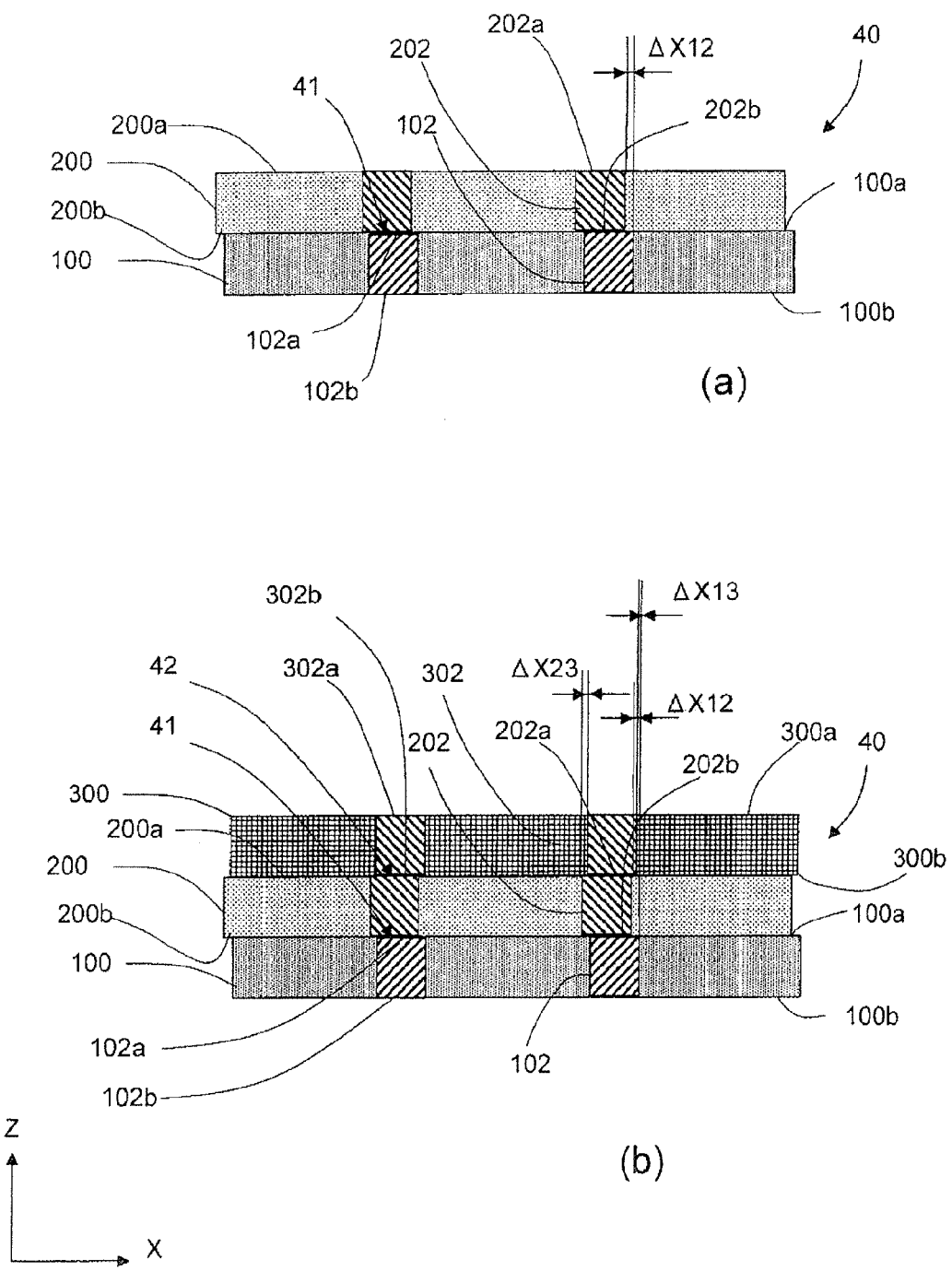
FIG. 11 shows sectional views respectively showing a state in which the first-layer of the semiconductor chip and the second-layer of the semiconductor chip are stacked and a state in which the first-layer of the semiconductor chip to a third-layer of the semiconductor chip are stacked, both by stacked bonding in production of the stacked semiconductor device.

As shown in Steps S201 and S202 in FIG. 8, the control unit 50 obtains an image of first surfaces 102a of first through-silicon vias 102 of the first-layer (initial-layer) of the semiconductor chip 100 illustrated in FIG. 10 and an image of alignment marks on a first surface 100a of the first-layer (initial-layer) of the semiconductor chip 100, and then as shown in Step S203 in FIG. 8, obtains an image of alignment marks on a second surface 200b of the second-layer of the semiconductor chip 200 illustrated in FIG. 10. Then, as shown in Step S204 in FIG. 8, the control unit 50 stacks and bonds the second-layer of the semiconductor chip 200 on the first-layer (initial-layer) of the semiconductor chip 100 illustrated in FIG. 10. After stacked bonding, as shown in Step S205 in FIG. 8, the control unit 50 obtains an image of the first surfaces 202a of the second through-silicon vias 202 of the second-layer of the semiconductor chip 200, and detects an amount of displacement ΔX between the first-layer of the semiconductor chip 100 and the second-layer of the semiconductor chip 200 in the X direction as shown in Step S206 in FIG. 8 based on the image of the first surfaces 102a of the first through-silicon vias 102 obtained in Step S201 in FIG. 8 and the image of the first surfaces 202a of the second through-silicon vias 202 obtained in Step S205 in FIG. 8. Then, as shown in Steps S201-S206, the control unit 50 detects the amount of displacement between the initial-layer (first-layer) of the semiconductor chip 100 and the second-layer of the semiconductor chip 200 for a predetermined number of times when two-layer of the semiconductor chips are stacked, and when it is determined to have been repeated for the predetermined number of times as shown in Step S207 in FIG. 8, sets an average of the predetermined number of amounts of displacement ΔX as the amount of offset, for example. It should be noted that the amount of offset can be set manually by an operator instead of executing the offset setting program 57 stored in the control unit 50.

Figure 9:
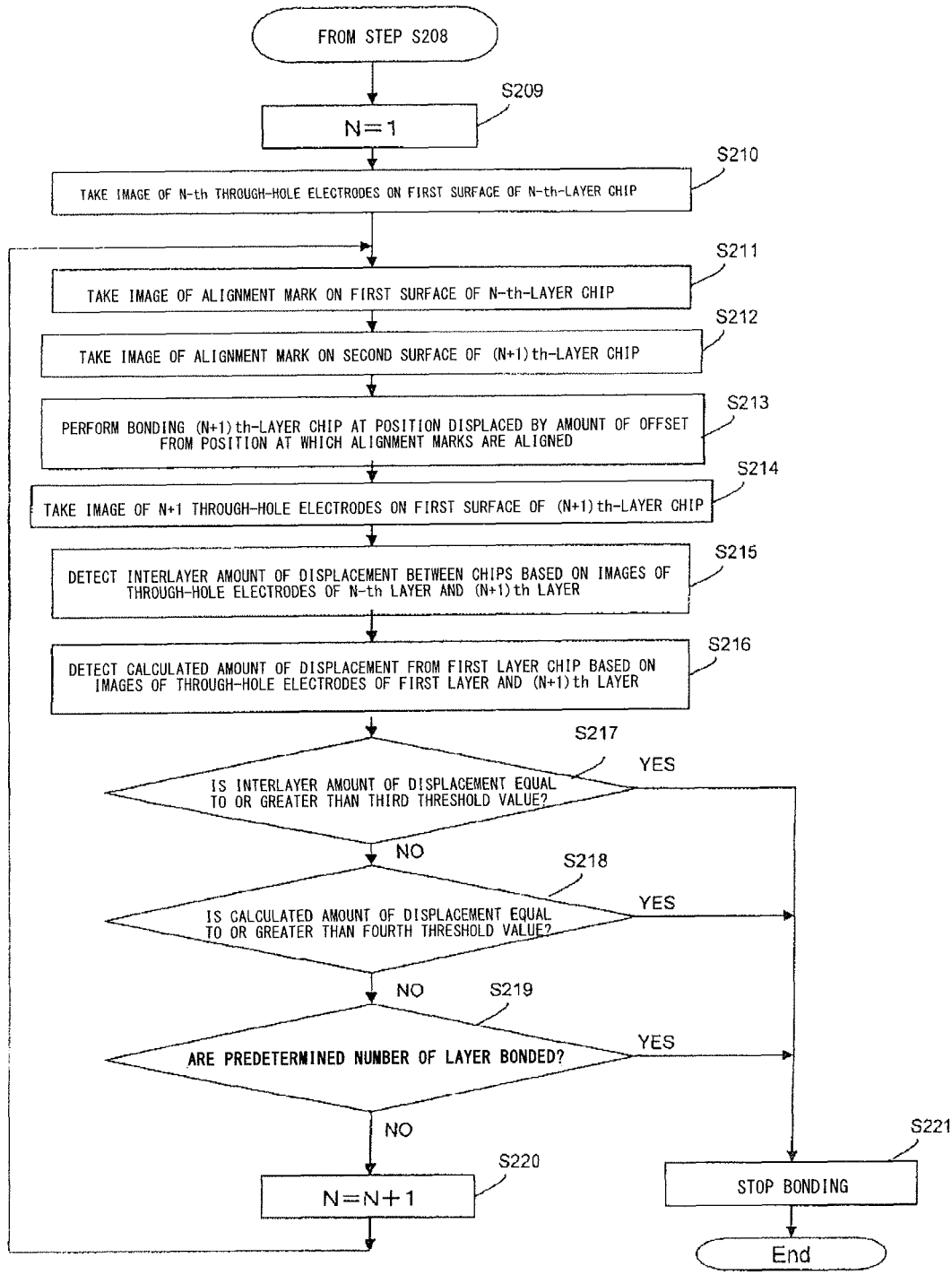
FIG. 9 is a flowchart showing yet another operation by the bonding apparatus according to the embodiment of the present invention.

Upon setting of the amount of offset in stacked bonding in the teaching operation shown in Steps S201-S208 in FIG. 8, the control unit 50 starts manufacturing of the stacked semiconductor device 40 as shown in Steps S209-S220 in FIG. 9. In this operation, based on an operation that is the same as that of Steps S109-S114 in FIG. 3, interlayer amounts of displacement ΔX12 and ΔX23 of the semiconductor chips 100 to 300 as illustrated in FIG. 11(b) are detected, a calculated amount of displacement ΔX13 of the third-layer of the semiconductor chip 300 with respect to the first-layer of the semiconductor chip 100 is detected, and bonding is stopped when any of the interlayer amounts of displacement ΔX12 and ΔX23 and the calculated amount of displacement ΔX13 is equal to or greater than a threshold value.

First, as shown in Step S209 in FIG. 9, the control unit 50 sets 1 as an initial value for a counter N. Next, as shown in Steps S210 and 211 in FIG. 9, the control unit 50 obtains the image of the first surfaces 102a of the first through-silicon vias (N=1) 102 of the first-layer (N=1) of the semiconductor chip 100 illustrated in FIG. 11(a), and the image of the alignment marks on the first surface 100a of the first-layer (N=1) of the semiconductor chip 100, and then as shown in Step S212 in FIG. 9, obtains the image of the alignment marks on the second surface 200b of the second-layer (N+1=2) of the semiconductor chip 200 illustrated in FIG. 11(a). Then, as shown in Step S213 in FIG. 9, the control unit 50 stacks and bonds the second-layer (N+1=2) of the semiconductor chip 200 on the first-layer (N=1) of the semiconductor chip 100 illustrated in FIG. 11(a), by displacing a position of each alignment mark by a predetermined amount of offset.

After stacked bonding, as shown in Step S214 in FIG. 9, the control unit 50 obtains the image of the first surfaces 202a of the second through-silicon vias 202 of the second-layer (N+1=2) of the semiconductor chip 200, and detects the amount of displacement ΔX12 between the first-layer (N=1) of the semiconductor chip 100 and the second-layer (N+1=2) of the semiconductor chip 200 in the X direction as shown in Step S215 in FIG. 9 based on the image of the first surfaces 102a of the first through-silicon vias 102 obtained in Step S210 in FIG. 9 and the image of the first surfaces 202a of the second through-silicon vias 202 obtained in Step S214 in FIG. 9. When the amount of offset and the amount of displacement in stacked bonding is the same, the relative positions of the first-layer and the second-layer of the semiconductor chip are the same, and the interlayer amount of displacement ΔX12 is zero. In practice, however, there is a slight error between the amount of offset and the amount of displacement in stacked bonding. Accordingly, as illustrated in FIG. 11(a), even when stacked bonding is performed by displacing the second-layer of the semiconductor chip 200 by the amount of offset, the interlayer amount of displacement ΔX12 is slightly produced between the first-layer of the semiconductor chip 100 and the second-layer of the semiconductor chip 200.

Further, as shown in Step S216 in FIG. 9, the control unit 50 detects a calculated amount of displacement in the X direction between the first-layer of the semiconductor chip 100 and the second-layer (N+1=2) of the semiconductor chip 200, based on the image of the first surfaces 102a of the first through-silicon vias 102 obtained in Step S210 in FIG. 9 and the image of the first surfaces 202a of the second through-silicon vias 202 obtained in Step S214 in FIG. 9. When two-layers are stacked, the calculated amount of displacement is identical with the interlayer amount of displacement ΔX12.

Next, as shown in Step S217 in FIG. 9, the control unit 50 compares the interlayer amount of displacement ΔX12 between the first-layer of the semiconductor chip 100 and the second-layer of the semiconductor chip 200 with a third threshold value, and when the interlayer amount of displacement Δ12 is equal to or greater than the third threshold value, the control unit 50 determines that this bonding is defective, and stops the bonding operation as shown in Step S221 in FIG. 9. Further, as shown in Step S218 in FIG. 9, the control unit 50 compares the calculated amount of displacement between the first-layer of the semiconductor chip 100 and the second-layer of the semiconductor chip 200 with a fourth threshold value, and when the calculated amount of displacement is equal to or greater than the fourth threshold value, the control unit 50 determines that this bonding is defective, and stops the bonding operation as shown in Step S221 in FIG. 9. As described above, when two-layers are stacked, the calculated amount of displacement is identical with the interlayer amount of displacement ΔX12.

Then, when both of the interlayer amount of displacement and the calculated amount of displacement are smaller than the third threshold value and the fourth threshold value, the control unit 50 determines whether a predetermined number of-layers of the semiconductor chips are bonded as shown in Step S219 in FIG. 9, and when the predetermined number of-layers are stacked and bonded, the control unit 50 stops bonding as shown in Step S221 in FIG. 9. Further, when it has not been determined that the predetermined number of-layers are stacked and bonded, as shown in Step S220 in FIG. 9, the control unit 50 increments the counter N by 1 to set N=2, returns the operation to Step S211 in FIG. 9, stacks and bonds the third-layer of the semiconductor chip 300 on the second-layer of the semiconductor chip 200 as shown in FIG. 11(b).

As shown in Step 211 in FIG. 9, the control unit 50 obtains an image of alignment marks on a first surface 200a of the second-layer (N=2) of the semiconductor chip 200 illustrated in FIG. 11(b), and then as shown by Step S212 in FIG. 9, obtains an image of alignment marks on a second surface 300b of the third-layer (N+1=3) of the semiconductor chip 300 illustrated in FIG. 11(b). Then, as shown by Step S213 in FIG. 9, the control unit 50 stacks and bonds the third-layer (N+1=3) of the semiconductor chip 300 on the second-layer (N=2) of the semiconductor chip 200 illustrated in FIG. 11(b) by displacing a position of each alignment mark by a predetermined amount of offset.

After stacked bonding, as shown in Step S214 in FIG. 9, the control unit 50 obtains an image of first surfaces 302a of third through-silicon vias 302 of the third-layer (N+1=3) of the semiconductor chip 300, and detects the interlayer amount of displacement $\Delta X23$ between the second-layer (N=2) of the semiconductor chip 200 and the third-layer (N+1=3) of the semiconductor chip 300 in the X direction as shown in Step S215 in FIG. 9 based on the image of the first surfaces 202a of the second through-silicon vias 202 obtained in Step S214 in FIG. 9 in a previous loop (N=1) and the image of first surfaces 302a of the third through-silicon vias 302 obtained in Step S214 in FIG. 9 in this loop (N=2). Similarly to the case between the first-layer and the second-layer, there is a slight error between the amount of offset and the amount of displacement in stacked bonding. Accordingly, as illustrated in FIG. 11(b), even when stacked bonding is performed by displacing the third-layer of the semiconductor chip 300 by the amount of offset, the interlayer amount of displacement $\Delta X23$ is slightly produced between the second-layer of the semiconductor chip 200 and the third-layer of the semiconductor chip 300.

Further, as shown in Step S210 in FIG. 9, the control unit 50 detects the calculated amount of displacement $\Delta X13$ in the X direction between the first-layer of the semiconductor chip 100 and the third-layer (N+1=3) of the semiconductor chip 300 as illustrated in FIG. 11(b), based on the image of the first surfaces 102a of the first through-silicon vias 102 obtained in Step S216 in FIG. 9 and the image of the first surfaces 302a of the third through-silicon vias 302 obtained in Step S214 in FIG. 9 in this loop (N=2). The calculated amount of displacement $\Delta X13$ is obtained by adding the interlayer amount of displacement $\Delta X12$ between the first-layer of the semiconductor chip 100 and the second-layer of the semiconductor chip 200 and the interlayer amount of displacement $\Delta X23$ between the second-layer of the semiconductor chip 200 and the third-layer of the semiconductor chip 300 ($\Delta X13=\Delta X12+\Delta X23$). As illustrated in FIG. 11(b), assuming that a direction of displacement of the second-layer with respect to the first-layer is a negative direction (leftward direction in the figure), a direction of displacement of the third-layer with respect to the second-layer is a positive direction (rightward direction in the figure). Therefore, an absolute value of the calculated amount of displacement $\Delta X13=\Delta X12+\Delta X23$ of the third-layer with respect to the first-layer is smaller than an absolute value of the interlayer amount of displacement $\Delta X12$ between the first-layer and the second-layer. By contraries, when the direction of displacement of the third-layer with respect to the second-layer is also the negative direction (leftward direction in the figure), the absolute value of the calculated amount of displacement $\Delta X13=\Delta X12+\Delta X23$ of the third-layer with respect to the first-layer becomes greater than the absolute value of the interlayer amount of displacement $\Delta X12$ between the first-layer and the second-layer.

Next, as shown Step S217 in FIG. 9, the control unit 50 compares the interlayer amount of displacement $\Delta X23$ between the second-layer of the semiconductor chip 200 and the third-layer of the semiconductor chip 300 with the third threshold value, and when the interlayer amount of displacement 423 is equal to or greater than the third threshold value, the control unit 50 determines that this bonding is defective, and stops the bonding operation as shown in Step S221 in FIG. 9. Further, as shown in Step S218 in FIG. 9, the control unit 50 compares the calculated amount of displacement $\Delta X13$ between the first-layer of the semiconductor chip 100 and the third-layer of the semiconductor chip 300 with the fourth threshold value, and when the calculated amount of displacement $\Delta X13$ is equal to or greater than the fourth threshold value, the control unit 50 determines that this bonding is defective, and stops the bonding operation as shown in Step S221 in FIG. 9.

Then, when both of the interlayer amount of displacement $\Delta X23$ and the calculated amount of displacement $\Delta X13$ are smaller than the third threshold value and the fourth threshold value, the control unit 50 determines whether a predetermined number of-layers of the semiconductor chips are bonded as shown in Step S219 in FIG. 9, and when the predetermined number of-layers are stacked and bonded, the control unit 50 stops bonding as shown in Step S221 in FIG. 9. Further, when it has not been determined that the predetermined number of-layers are stacked and bonded, as shown in Step S220 in FIG. 9, the control unit 50 increments the counter N by 1 to set N=3, returns the operation to Step S211 in FIG. 9, stacks and bonds the fourth-layer of the semiconductor chip on the third-layer of the semiconductor chip 300.

According to the embodiment described above, bonding is stopped when all of the interlayer amounts of displacement $\Delta X12$ and $\Delta X23$, and the calculated amount of displacement $\Delta X13$ are equal to or greater than a predetermined threshold value, and thus, it is possible to improve qualities of the stacked semiconductor device 40 manufactured by stacked bonding.

In this embodiment, it is described that the amount of displacement is the amounts of displacement $\Delta X12$, $\Delta X23$, or $\Delta X13$ in the X direction. However, for the amount of displacement in the Y direction or in the $\theta$ direction, it is also possible to stop bonding when all of the interlayer amounts of displacement and the calculated amount of displacement are equal to or greater than a predetermined threshold value.

The present invention is not limited to the embodiment described above, and includes any modifications and alterations without departing from the technical scope and the spirit of the present invention defined by the appended claims.

REFERENCE SIGNS LIST

11: Bonding Stage
12: XY Table
13: Bonding Stage Driving Mechanism
14: Bonding Tool
15: Bonding Tool Driving Mechanism
16: Double-View Camera
20: First-layer of the Semiconductor Chip
20a, 22a, 30a, 32a: First Surface
20b, 22b, 30b, 32b: Second Surface
21a, 31a, 31b: Alignment Mark
22: First Through-Silicon Via
30: Second-layer of the Semiconductor Chip
32: Second Through-Silicon Via
40: Stacked Semiconductor device
41: Hardened-layer
50: Control Unit
51: CPU
52: Memory
53: Relative-Position Detection Program
54: First Imaging Program 55: First Bonding Program
56: Second Imaging Program
57: Offset Setting Program
58: Second Bonding Program
59: Third Imaging Program
60: Displacement Detection Program
61: Offset Correction Program
62: Stopping Program
63: Control Data
64: Bonding Tool Driving Mechanism Interface
65: Double-View Camera Interface
66: Bonding Stage Driving Mechanism Interface
70: Data Bus
100, 200, 300: Semiconductor Chip
100a, 102a, 200a, 202a, 300a, 302a: First Surface
102, 202, 302: Through-Silicon Via
100b, 200b, 300b: Second Surface
500: Flip-Chip Bonding Apparatus

The invention claimed is:

1. A bonding apparatus comprising:
   a camera configured to take images of semiconductor chips; and
   a control unit configured to perform image processing of the images taken by the camera, and configured to perform bonding control of stacking and bonding a second-layer of the semiconductor chips onto a first-layer of the semiconductor chips, the first-layer of the semiconductor chip having a first through-silicon via, the second-layer of the semiconductor chip having a second through-silicon via at positions corresponding to the first through-silicon via, wherein the control unit comprises:
   a relative position detecting means configured to detect relative positions of the layers of the semiconductor chips that have been stacked and bonded based on an image of the first through-silicon via on a first surface of the first-layer of the semiconductor chip taken by the camera before stacked bonding, and an image of the second through-silicon via on a first surface of the second-layer of the semiconductor chip taken by the camera after stacked bonding;
   wherein the relative positions are represented by one or more of positional displacement of the second-layer of the semiconductor chip in a direction along a reference axis on the first surface of the first-layer of the semiconductor chip, positional displacement of the second-layer of the semiconductor chip in a direction perpendicular to the reference axis, and a rotational angle of the second-layer of the semiconductor chip with respect to the reference axis.

2. The bonding apparatus according to claim 1, wherein the first-layer of the semiconductor chip and the second-layer of the semiconductor chip are two adjacent layers of the semiconductor chips.

3. The bonding apparatus according to claim 1, wherein the first-layer of the semiconductor chip is an initial-layer of the semiconductor chips, and the second-layer of the semiconductor chip is a different one of the semiconductor chips that is stacked and bonded on top of the initial-layer of the semiconductor chip.

4. A bonding apparatus comprising:
   a camera configured to take images of semiconductor chips; and
   a control unit configured to perform image processing of the images taken by the camera, and configured to perform bonding control of stacking and bonding a second-layer of the semiconductor chips onto a first-layer of the semiconductor chips, the first-layer of the semiconductor chip having a first through-silicon via, the second-layer of the semiconductor chip having a second through-silicon via at positions corresponding to the first through-silicon via, wherein the control unit comprises:
   a relative position detecting means configured to detect relative positions of the layers of the semiconductor chips that have been stacked and bonded based on an image of the first through-silicon via on a first surface of the first-layer of the semiconductor chip taken by the camera before stacked bonding, and an image of the second through-silicon via on a first surface of the second-layer of the semiconductor chip taken by the camera after stacked bonding;
   wherein the control unit comprises
   a first imaging means configured to take the image of the first through-silicon via on the first surface of the first-layer of the semiconductor chip using the camera before stacked bonding;
   a first bonding means configured to stack and bond the second-layer of the semiconductor chip onto the first-layer of the semiconductor chip by aligning a first alignment mark on the first surface of the first-layer of the semiconductor chip taken by the camera before stacked bonding and a second alignment mark on a second surface of the second-layer of the semiconductor chip taken by the camera before stacked bonding;
   a second imaging means configured to take the image of the second through-silicon vias on the first surface of the second-layer of the semiconductor chip using the camera after stacked bonding by the first bonding means; and
   an offset setting means configured to detect the relative positions of the layers of the semiconductor chips based on the image of the first through-silicon vias taken by the first imaging means and the image of the second through-silicon vias taken by the second imaging means, and to set the detected relative positions as an amount of offset in stacked bonding.

5. The bonding apparatus according to claim 4, wherein the control unit comprises:
   second bonding means configured to stack and bond the second-layer of the semiconductor chip onto the first-layer of the semiconductor chip by displacing the second-layer of the semiconductor chip by the amount of offset set by the offset setting means from a position at which the first alignment mark and the second alignment mark are aligned;
   third imaging means configured to take the image of the second through-silicon vias on the first surface of the second-layer of the semiconductor chip by the camera after stacked bonding by the second bonding means; and
   displacement detecting means configured to detect an amount of displacement of the relative positions of the layers of the semiconductor chips based on the image of the first through-silicon vias taken by the first imaging means and the image of the second through-silicon vias taken by the third imaging means.

6. The bonding apparatus according to claim 5, wherein the control unit comprises:
   offset correcting means configured to correct the amount of offset by a predetermined percentage of the amount of displacement when the amount of displacement detected by the displacement detecting means is smaller than a first threshold value and equal to or greater than a second threshold value.

* * * * *